(12) United States Patent
Elbanhawy

(10) Patent No.: US 6,870,217 B2
(45) Date of Patent: Mar. 22, 2005

(54) METHOD OF AND APPARATUS FOR DRIVING A DUAL GATED MOSFET

(75) Inventor: Alan Elbanhawy, Hollister, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/686,859

(22) Filed: Oct. 16, 2003

(65) Prior Publication Data

US 2004/0135201 A1 Jul. 15, 2004

Related U.S. Application Data

(63) Continuation-in-part of application No. 10/640,742, filed on Aug. 14, 2003.
(60) Provisional application No. 60/405,369, filed on Aug. 23, 2002.

(51) Int. Cl.$^7$ .............................................. H01L 21/331
(52) U.S. Cl. ...................................... 257/333; 257/335
(58) Field of Search ................................. 257/333, 335, 257/288, 340, 137

(56) References Cited

U.S. PATENT DOCUMENTS 4,941,026 A 7/1990 Temple

*Primary Examiner*—Long Pham
*Assistant Examiner*—Hoa B. Trinh
(74) *Attorney, Agent, or Firm*—Thomas R. FitzGerald, Esq.; Laurence S. Roach, Esq.

(57) ABSTRACT

A method of driving a dual-gated MOSFET having a Miller capacitance between the MOSFET gate and drain includes preparing the MOSFET to switch from a blocking mode to a conduction mode by applying to the MOSFET shielding gate a first voltage signal having a first voltage level. The first voltage level is selected to charge the Miller capacitance and thereby reduce switching losses. A second voltage signal is applied to the switching gate to switch the MOSFET from the blocking to the conduction mode. The first voltage signal is then changed to a level selected to reduce the conduction mode drain-to-source resistance and thereby reduce conduction losses. The first voltage signal is returned to the first voltage level to prepare the MOSFET for being switched from the conduction mode to the blocking mode.

7 Claims, 3 Drawing Sheets

METHOD OF AND APPARATUS FOR DRIVING A DUAL GATED MOSFET

CROSS-REFERENCE TO RELATED APPLICATIONS

This application is a continuation-in-part of U.S. patent application Ser. No. 10/640,742, filed Aug. 14, 2003 and entitled METHOD AND APPARATUS FOR IMPROVED MOS GATING TO REDUCE MILLER CAPACITANCE AND SWITCHING LOSSES which, in turn, claims the benefit of U.S. Provisional Patent Application Ser. No. 60/405,369, filed Aug. 23, 2002.

FIELD OF THE INVENTION

The present invention relates to semiconductors and, more particularly, to a method of and apparatus for driving dual-gate metal-oxide semiconductor field effect transistors (MOSFETs).

DESCRIPTION OF THE RELATED ART

MOSFETs are used extensively in switching applications, such as, for example, switching power supplies, practically to the exclusion of other types of transistors. MOSFETs are suited to such switching applications due to their relatively high switching speed and low power requirements. However, the dynamic losses in conventional MOSFETs represent a large percentage of the total losses in DC-to-DC converters. The dynamic losses of conventional MOSFETS are directly proportional to the device rise and fall times which are, in turn, proportional to the gate-to-drain capacitance, i.e., the Miller capacitance, of the devices ($C_{GD}$ or $Q_{GD}$).

The Miller capacitance is reduced by reducing the area over which the gate and drain regions overlap. In prior art devices, this overlap area includes the bottom of the gate trench. Many prior art attempts to reduce the Miller capacitance have therefore focused on narrowing the trench width to thereby reduce the width of the trench bottom and thus the overlap area. However, the ability to further reduce trench width is limited by the ability to etch narrow trenches, and the corresponding need to be able to fill the narrow trenches with gate electrode material.

A dual-gated MOSFET device as described in co-pending U.S. patent application Ser. No. 10/640,742, filed Aug. 14, 2003 and entitled METHOD AND APPARATUS FOR IMPROVED MOS GATING TO REDUCE MILLER CAPACITANCE AND SWITCHING LOSSES, the disclosure of which is incorporated herein by reference, virtually eliminates the Miller capacitance and the switching losses associated therewith by providing a dual-gated structure that reduces the area over which the gate and drain regions overlap. Generally, the dual-gated structure includes a shielding gate and a control gate. The shielding gate is biased into the on or conduction state either continuously or just prior to a switching event thereby placing the device into the conduction mode. The shielding gate charges the gate-to-drain overlap region, which as stated above is the region that generates the Miller capacitance in a conventional device. With the shielding gate thus biased, the current flow through the dual-gated device is controlled and is easily switched on and/or off by the voltage level applied to the switching or control gate.

In order to gain the full advantage of the desirable characteristics of such a dual-gated device, however, drive signals having specific voltage levels at particular times must be applied to each of the shielding and switching gates. More particularly, drive signals having a specific sequence of voltage levels must be applied to each of the shielding and switching gates in order to achieve both fast switching times and low resistance between the drain and source when the device is in the on or conduction state (RDSon).

Therefore, what is needed in the art is a method and apparatus for driving a dual-gated MOSFET.

SUMMARY OF THE INVENTION

The present invention provides a method and apparatus for driving a dual-gated MOSFET.

The invention comprises, in one form thereof, a method of driving a dual-gated MOSFET having a Miller capacitance between the MOSFET gate and drain. The method includes preparing the MOSFET to switch from a blocking mode to a conduction mode by applying to the MOSFET shielding gate/electrode a first voltage signal having a first voltage level. The first voltage level is selected to charge the Miller capacitance and thereby reduce switching losses. A second voltage signal is applied to the switching gate to switch the MOSFET from the blocking to the conduction mode. The first voltage signal is then changed to a level selected to reduce the conduction mode drain-to-source resistance and thereby reduce conduction losses. The first voltage signal is returned to the first voltage level to prepare the MOSFET for being switched from the conduction mode to the blocking mode.

An advantage of the present invention is that the gate voltage signals are applied to the gates of the dual-gated MOSFET in such levels and in such a sequence so as to substantially reduce drain-to-source resistance in the on-state.

Yet another advantage of the present invention is that the gate voltage signals are applied to the gates of the dual-gated MOSFET in such levels and in such a sequence so as to substantially increase switching times.

A still further advantage of the present invention is that the gate voltage signals are applied to the gates of the dual-gated MOSFET in such levels and in such a sequence so as to substantially reduce Miller capacitance and switching losses.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
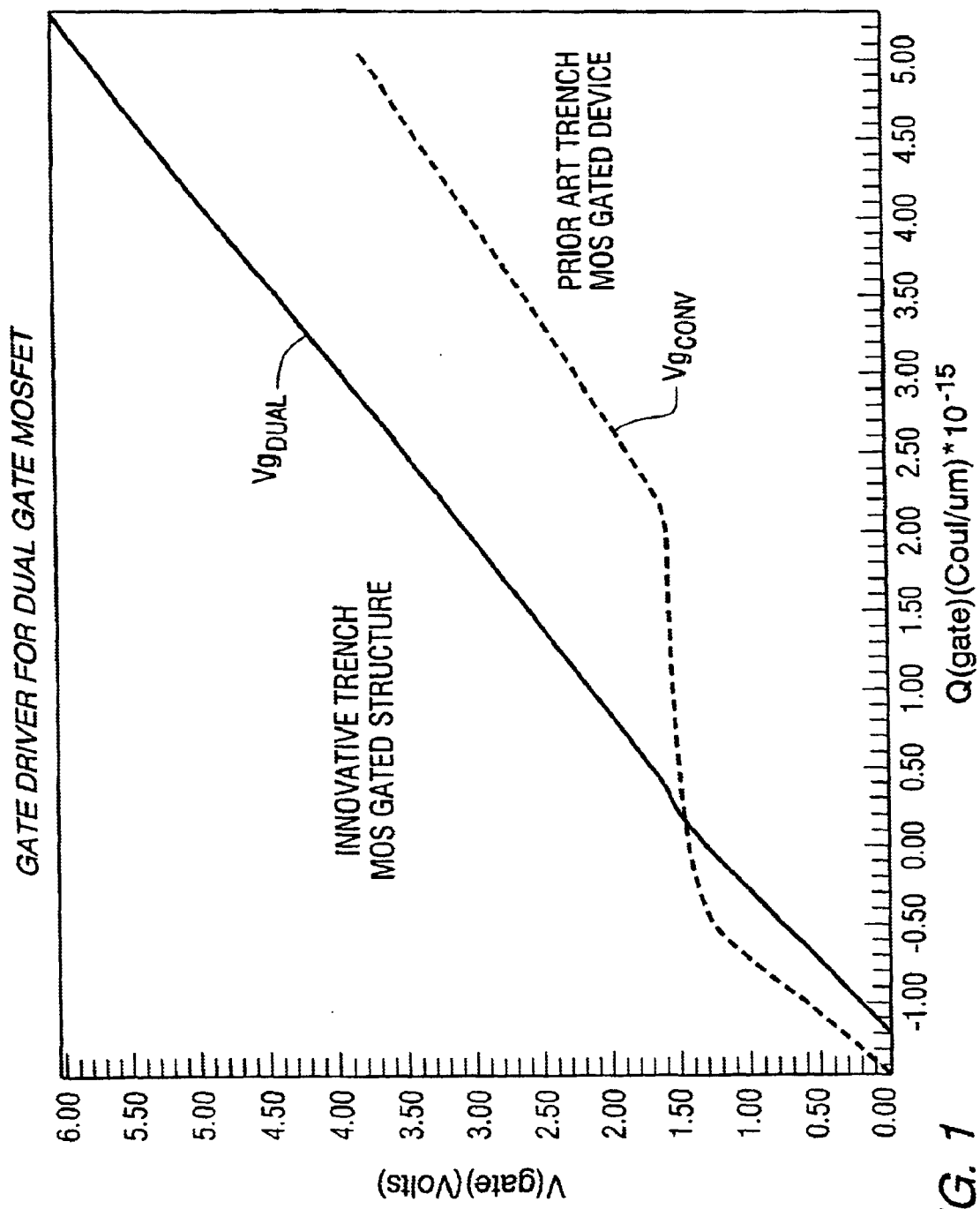
FIG. 1 is a plot of the applied gate voltage versus gate charge for both a conventional MOSFET and a dual-gated MOSFET.

Referring now to the drawings, and particularly to FIG. 1, the gate voltage $Vg_{CONV}$ of a conventional MOSFET and the gate voltage $Vg_{DUAL}$ of a dual-gated MOSFET device are each plotted versus the gate charge applied thereto. As FIG. 1 shows, a "flat" region M exists in the gate charge curve $Vg_{CONV}$ of the conventional MOSFET. Within flat region M the gate charge $Q_{gate}$ increases from approximately −0.5 to approximately $2.00 \times 10^{-15}$ Coulombs per micrometer while the voltage applied to the gate remains relatively constant at approximately 1.5 Volts. Flat region M, referred to as the Miller region, occurs due to the Miller capacitance of the conventional MOSFET.

Flat region M corresponds to the charging and/or discharging of the Miller capacitance as the conventional MOSFET undergoes the transition from a blocking state to a conducting state or from a conducting state to a blocking state. It is in the Miller region M that most of the switching losses in a conventional MOSFET occur since the device current and voltage are each relatively high. Reducing the Miller capacitance reduces the time the device requires to undergo the transition from conduction to blocking or vice-versa, and thereby reduces switching losses. In contrast to the conventional MOSFET device, the gate voltage waveform $Vg_{DUAL}$ for the dual-gated MOSFET device has virtually no flat or Miller region. Thus, the dual-gated MOSFET device has a substantially reduced Miller capacitance relative to a conventional MOSFET.

Figure 2:
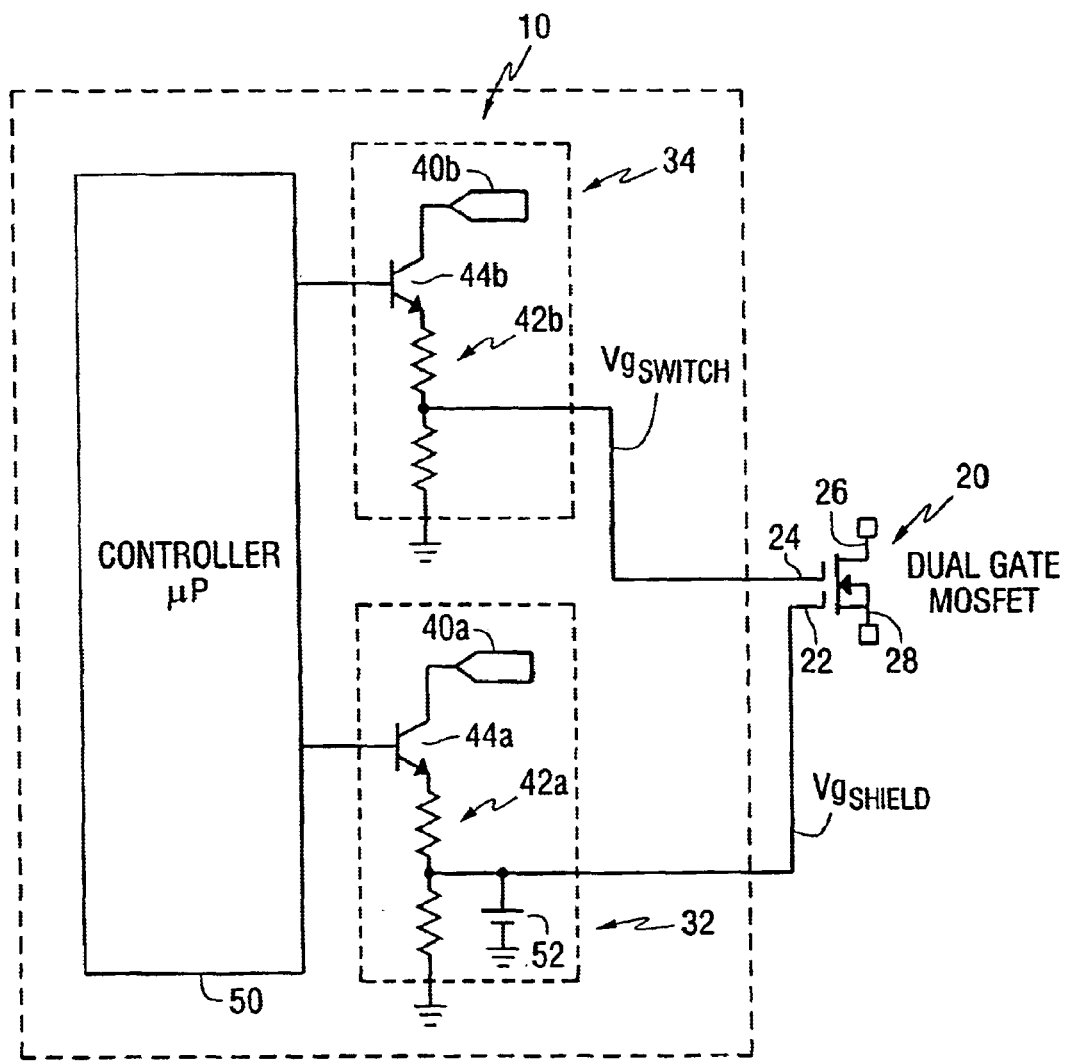
FIG. 2 is a schematic diagram of one embodiment of a circuit of the present invention for driving a dual-gated MOSFET.

Referring now to FIG. 2, there is shown a schematic representation of one embodiment of a driving circuit of the present invention for driving a dual-gated MOSFET. Generally, dual gate driving circuit 10 is configured for driving dual-gated MOSFET 20, which has a dual overlapping gate structure that reduces Miller capacitance and improves switching speed. More particularly, dual-gated MOSFET 20 includes shielding gate 22, switching/control gate 24, drain 26 and source 28. The structure, method of manufacture, and theory of operation of MOSFET 20 are thoroughly described in the above-mentioned U.S. patent application Ser. No. 10/640,742, filed Aug. 14, 2003 and entitled METHOD AND APPARATUS FOR IMPROVED MOS GATING TO REDUCE MILLER CAPACITANCE AND SWITCHING LOSSES, which has been incorporated herein by reference. Driving circuit 10 also includes first or shield gate voltage signal generating means 32 and second or switching gate voltage generating means 34.

First or shield gate voltage signal generating means 32, hereinafter referred to as voltage signal source 32, is electrically connected to shielding gate 22 and provides thereto shield gate voltage signal $Vg_{SHIELD}$. Second or switching gate voltage signal generating means 34, hereinafter referred to as voltage signal source 34, is electrically connected to switching/control gate 24 and provides thereto switching/control gate voltage signal $Vg_{SWITCH}$. Shield gate voltage source 32 and switching gate voltage source 34 are each configured, for example, as voltage sources 40a, 40b, respectively, that are selectively connected to corresponding voltage-divider circuits 42a, 42b, through transistor switches 44a, 44b, respectively. Each of transistor switches 44a, 44b, are electrically connected to respective outputs of a microprocessor, analog or digital controller 50, via corresponding buffers or drivers (not shown) if necessary. The microprocessor or controller 50 opens and/or closes transistor switches 44a, 44b to selectively connect voltage sources 40a, 40b to the corresponding voltage divider circuits 44a, 44b. Thus, microprocessor or controller 50 controls the voltage across the voltage divider circuit and thereby produces the gate voltage waveforms $Vg_{SHIELD}$ and $Vg_{SWITCH}$. Voltage supply 52 is electrically connected with shielding gate 22, and maintains shielding gate 22 at a predetermined voltage level as is more particularly described hereinafter.

Figure 3:
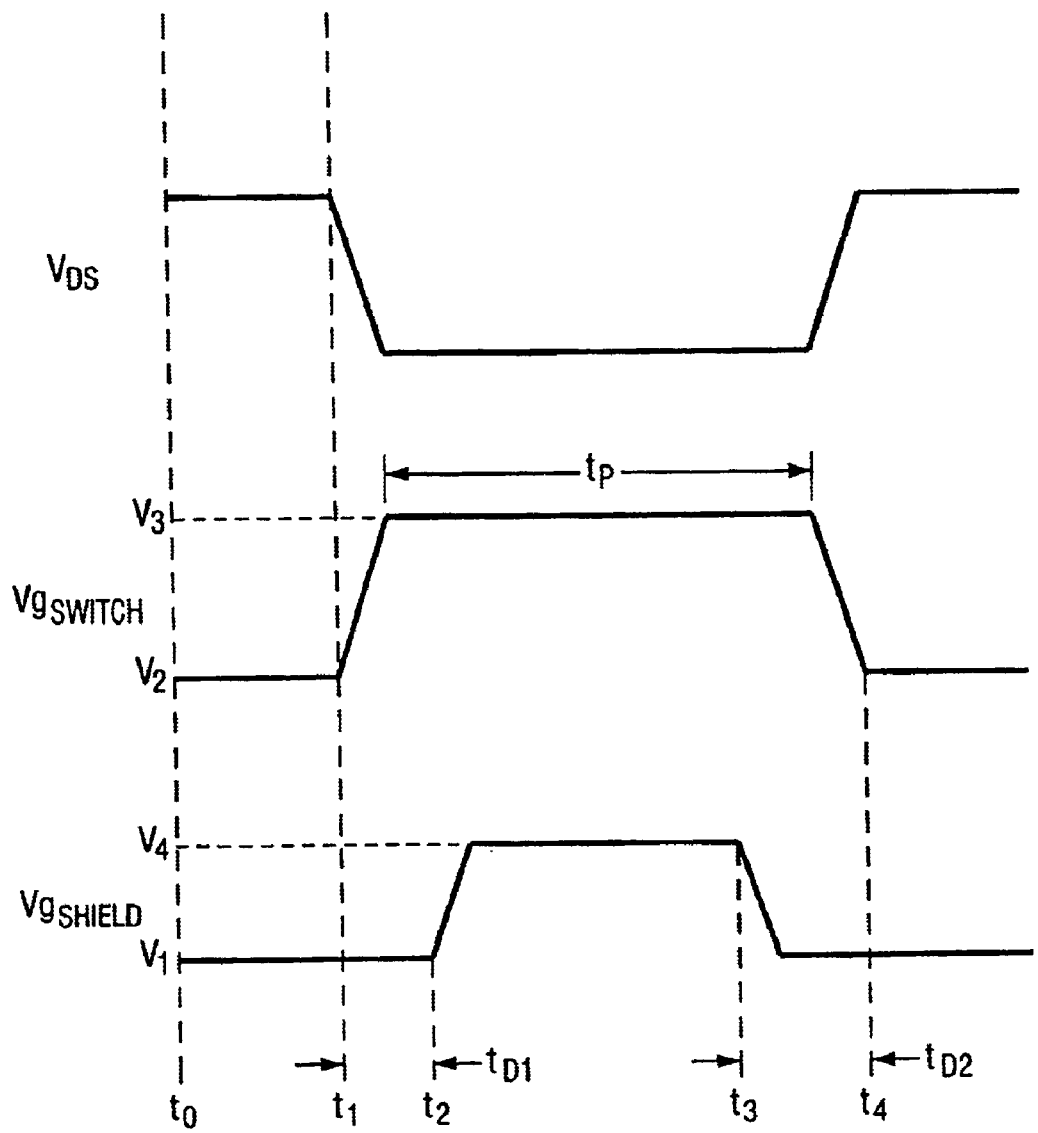
FIG. 3 shows the voltage signals applied to the gates of a dual-gated MOSFET according to one embodiment of the method for driving a dual-gated MOSFET of the present invention.

Referring now to FIG. 3, the voltage signals generated by voltage signal source 32 and voltage signal source 34, and which are applied to each of the gates of dual-gated MOSFET 20 according to one embodiment of the method for driving a dual-gated MOSFET of the present invention, are shown. More particularly, FIG. 3 shows the voltage signals $Vg_{SHIELD}$ and $Vg_{SWITCH}$, which as described above are electrically connected to and drive shielding 22 and switching 24 electrodes/gates, respectively, of dual-gated MOSFET 20. The resulting voltage signal $V_{DS}$ between drain 26 and source 28 is also shown. Generally, voltage signal $Vg_{SHIELD}$ prepares MOSFET 20 to be switched and thereby reduces the undesirable effects of the Miller capacitance on the switching characteristics of MOSFET 20, whereas $Vg_{SWITCH}$ controls the actual switching of MOSFET 20 between the conduction and blocking states. Once MOSFET 20 has been placed into the conduction mode, the voltage level of $Vg_{SHIELD}$ is controlled to optimize/reduce the resistance between drain 26 and source 28.

More particularly, at and/or prior to time $t_0$ signal $Vg_{SHIELD}$ maintains shielding gate 22 at voltage level $V_1$, such as, for example, approximately three to six volts. Voltage supply 52 either continuously maintains voltage signal $Vg_{SHIELD}$ at voltage level $V_1$ or brings voltage signal $Vg_{SHIELD}$ to voltage level $V_1$ at a predetermined amount of time prior to a switching event. Voltage level $V_1$ is selected to be of a sufficient level to support a driving voltage level, i.e., to substantially completely charge the Miller capacitance and prepare the channel of MOSFET 20 for conduction, thereby minimizing the effects of the Miller capacitance on the switching characteristics of MOSFET 20. In effect, application of voltage signal $Vg_{SHIELD}$ at voltage level $V_1$ to shield gate 22 charges the gate-to-drain overlap region of MOSFET 20, which is the region that generates the Miller capacitance in a conventional MOSFET device, and thereby optimizes the rise and/or fall times of switching gate 22. Once that gate-to-drain overlap region is charged by the application of voltage signal $Vg_{SHIELD}$ at voltage level $V_1$ to shield electrode or gate 22, MOSFET 20 is easily and quickly switched on and/or off by a relatively small change in the voltage level of voltage signal $Vg_{SWITCH}$ applied to switching electrode/gate 24.

In short, the application of voltage level $V_1$ to shielding gate 22 preparatorily charges the Miller capacitance of MOSFET 20 for an impending or an eventual switching event, thereby optimizing the rise and fall times of switching gate 24. Once shield gate 22 has been switched, only conduction losses (which are relatively small compared to switching losses or losses due to Miller capacitance) occur during the switching of MOSFET 20.

A switching event is commenced at time $t_1$ by causing signal $Vg_{SWITCH}$ to transition from voltage level $V_2$, such as, for example, approximately zero volts or ground potential, toward voltage level $V_3$, such as, for example, from approximately 5 to 10 Volts, to thereby switch MOSFET 20 from a blocking mode into a conduction mode. This transition is reflected by the corresponding transition at approximately time $t_1$ of $V_{DS}$ from a high voltage level to a low voltage. At time $t_2$ signal $Vg_{SHIELD}$ begins to transition from voltage level $V_1$ toward voltage level $V_4$. The delay time $t_{D1}$ is the duration between times $t_1$ and $t_2$, and is dependent at least in part upon the rise time of switching gate 24. Preferably, delay time $t_{D1}$ is approximately equal to the rise time of switching gate 24. However, various sources may introduce additional delay between times $t_1$ and $t_2$ thereby making $t_{D1}$ somewhat greater than the rise time of switching gate 24. Therefore, $Vg_{SWITCH}$ may reach voltage level $V_3$ prior to time $t_2$, and thus prior to the beginning of the transition of $Vg_{SHIELD}$ from voltage level $V_1$ toward voltage level $V_4$. $Vg_{SHEILD}$ remains at voltage level $V_3$ for a duration of time $t_p$.

$Vg_{SHIELD}$ rises at time $t_2$ from voltage level $V_1$ toward voltage level $V_4$, such as, for example, from approximately 9 to 13 Volts, that is selected to optimize/reduce the resistance between drain 26 and source 28 while MOSFET 20 is in the on or conduction state, i.e., $R_{DSon}$. Thus, conduction losses during the on-state operation of MOSFET 20 are substantially reduced.

In preparation for and/or in order to commence a second or return switching event, and switch MOSFET 20 from the conduction to the blocking mode, the voltage level of $Vg_{SHIELD}$ is reduced at time $t_3$ from voltage level $V_4$ back toward voltage level $V_1$. Thereafter, $Vg_{SHIELD}$ is either continuously maintained at voltage level $V_1$, or is reduced to a different voltage level, such as, for example, ground potential, and then returned to voltage level $V_1$ at a predetermined amount of time prior to the next switching event.

At time $t_4$ VgSWITCH is switched from voltage level $V_3$ back toward voltage level $V_2$. The delay time $t_{D2}$ is the duration between times $t_3$ and $t_4$, and is dependent at least in part upon the fall time of switching gate 24. This transition is reflected by a corresponding transition at approximately time $t_4$ of VDS from a low voltage to a high voltage level. Preferably, delay time $t_{D2}$ is approximately equal to the fall time of switching gate 24. However, various sources may introduce additional delay between times $t_3$ and $t_4$ thereby making $t_{D2}$ somewhat greater than the fall time of switching gate 24.

In the embodiment shown, the shield and switching gate voltage sources are configured as voltage sources driving voltage-divider circuits through transistor switches which are electrically connected to respective outputs of a microprocessor, analog or digital controller, via corresponding buffers or drivers if necessary, to thereby produce the gate voltage waveforms $Vg_{SHIELD}$ and $Vg_{SWITCH}$. However, it is to be understood that the actual configuration of the shield and switching gate voltage sources can be alternately configured various ways.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A circuit for driving a dual-gated MOSFET, said dual-gated MOSFET being switchable between conduction and blocking modes, said dual-gated MOSFET having a shielding gate, a switching gate, a gate-to-drain overlap region, and a drain-to-source resistance when the MOSFET is in the conduction mode, said circuit comprising:

means for generating a first voltage signal for driving said shielding gate, said first voltage signal having a first voltage level for charging the gate-to-drain overlap region and a fourth voltage level for reducing the drain-to-source resistance when the MOSFET is in the conduction mode;

means for generating a second voltage signal for driving the switching gate, said second voltage signal being switchable between a low and a high voltage level; and control means for controlling each of said means for generating to thereby switch the MOSFET between the conduction and blocking modes.

2. The circuit of claim 1, wherein said control means causes said means for generating a first voltage signal to maintain said first voltage signal at said first voltage level or bring said first voltage signal to said first voltage level at a predetermined amount of time prior to switching the MOSFET from the blocking to the conduction mode.

3. The circuit of claim 2, wherein said control means causes said means for generating said second voltage signal to be switched from said low to said high voltage level thereby causing the MOSFET to enter the conduction mode, and at a first delay time thereafter causes said first voltage signal to be switched from said first voltage level for charging the gate-to-drain overlap region to said fourth voltage level for reducing the drain-to-source resistance while the MOSFET is in the conduction mode.

4. The circuit of claim 2, wherein said control means causes said means for generating said first voltage signal to be switched from said fourth voltage level for reducing the drain-to-source resistance to said first voltage level for charging the gate-to-drain overlap region or to ground potential, and at a second delay time thereafter causes said second voltage signal to be switched from said high voltage level to said low voltage level.

5. The circuit of claim 2, wherein said first voltage level for charging the gate-to-drain overlap region is from approximately three to approximately six volts.

6. The circuit of claim 2, wherein said fourth voltage level for reducing the drain-to-source resistance is from approximately nine to approximately thirteen volts.

7. The circuit of claim 2, wherein said low voltage level of said second voltage signal is one of approximately zero volts and approximately ground potential.

* * * * *